United States Patent [19]

Peoples

[11] 4,254,446

[45] Mar. 3, 1981

[54] MODULAR, HYBRID INTEGRATED CIRCUIT ASSEMBLY

[76] Inventor: Ric L. Peoples, 1027 Cynthia La., San Jose, Calif. 95129

[21] Appl. No.: 71,234

[22] Filed: Aug. 30, 1979

[51] Int. Cl.³ .................. H01G 4/02; H01L 23/02; H01L 23/16
[52] U.S. Cl. ................................. 361/383; 361/382; 361/393; 357/74; 357/75; 357/80; 357/81
[58] Field of Search .............. 357/74, 357/75, 80, 81; 361/381, 382, 383, 392, 393

[56] References Cited

U.S. PATENT DOCUMENTS

| | | | |
|---|---|---|---|
| 3,239,719 | 3/1966 | Shower | 357/80 |
| 3,305,705 | 2/1967 | Tillmanns et al. | 361/393 |
| 3,323,022 | 5/1967 | DaCosta | 357/80 |
| 3,340,438 | 9/1967 | Dion et al. | 361/393 |
| 3,406,368 | 10/1968 | Curran | 361/383 |
| 3,549,949 | 12/1970 | Granberry | 361/393 |
| 3,555,364 | 1/1971 | Matcovich | 357/80 |
| 3,706,010 | 12/1972 | Laermer et al. | 361/383 |
| 3,875,478 | 4/1975 | Capstick | 357/80 |
| 3,914,878 | 10/1975 | Lu | 361/393 |
| 4,137,559 | 1/1979 | Reuting | 361/393 |

Primary Examiner—Andrew J. James
Attorney, Agent, or Firm—Paul L. Hickman

[57] ABSTRACT

A modular, hybrid integrated circuit assembly is disclosed which includes a number of integrated circuit modules which can be assembled together to create any number of different hybrid electronic circuits. The modules are designed to minimize semiconductor device interconnect path lengths to increase the speed and reliability of the resultant hybrid electronic circuit. The integrated circuit modules are preferably substantially disk shaped and are provided with a plurality of contacts on both sides as well as four equally spaced notches formed in their edges. the modules are assembled like a stack of coins so that the contacts of adjacent modules are pressed together. The assembled modules are held together under pressure by a module carrier that is provided with lead-pins formed into a standard DIP configuration. Bus-bars of the module carrier engage at least some of the notches of the modules to electrically couple the modules to the lead-pins.

18 Claims, 6 Drawing Figures

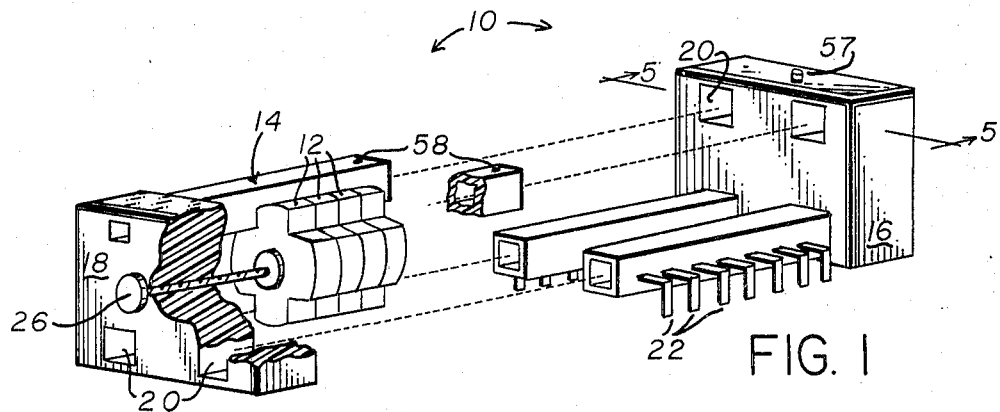
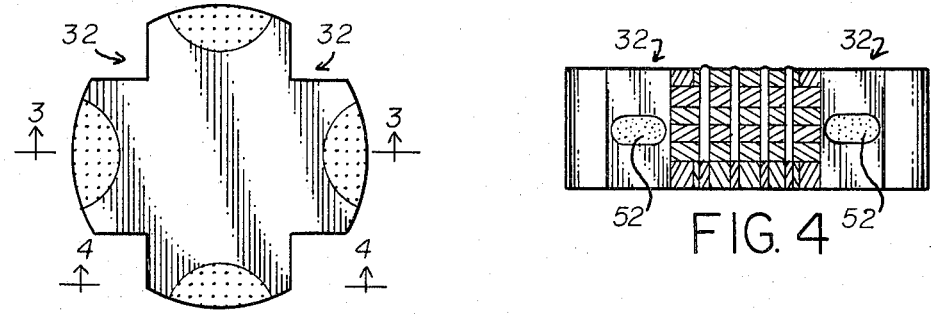
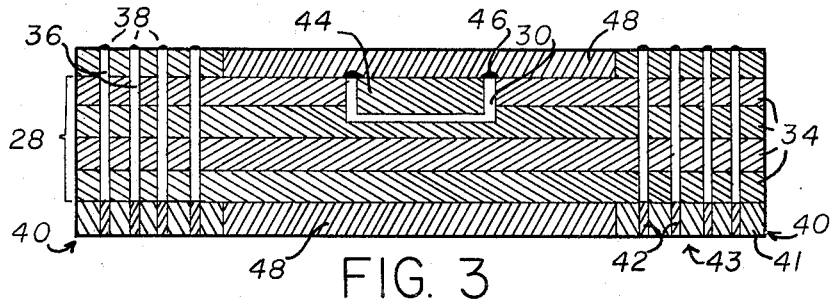
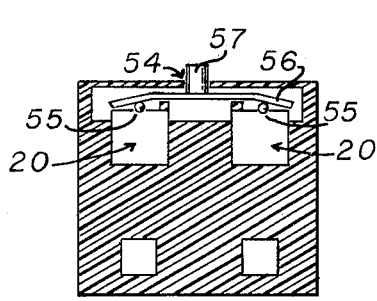
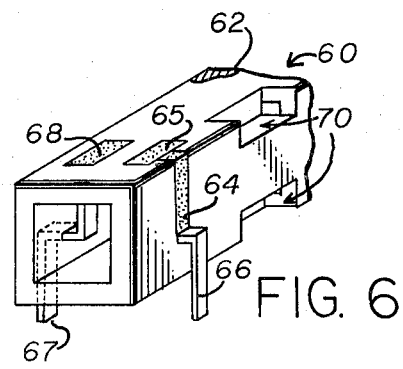

MODULAR, HYBRID INTEGRATED CIRCUIT ASSEMBLY

BACKGROUND OF THE INVENTION

1. Field of the Invention

This invention relates generally to semiconductor integrated circuits and more particularly to high density packaging for integrated circuits.

2. Description of the Prior Art

There is a continuing trend in the electronic industry to pack more and more electronic devices into smaller and smaller spaces. The reasons for this trend are many. One obvious reason is that electronic assemblies can be made smaller and more convenient. Another, more subtle reason for miniaturization is to minimize inter-device lead length which is often a critical factor in the high frequency response of an electronic circuit, particularly in the case of high speed digital devices.

There are two well accepted methods for increasing the density of electronic circuits. One method is to create ever more semiconductor interconnections at the chip (also known as the "die") level. Great strides have been accomplished with this method in the last few years with the L.S.I. and V.L.S.I. technologies. The second method for increasing the density of electronic circuits involves maximizing the use of printed circuit (P.C.) real estate by packaging semiconductor chips more efficiently. It is to the second method of increasing the density of electronic circuits that this invention is directed.

Large plastic and ceramic DIPs (Dual In-Line Packages) having from 14 to 64 lead pins are well known to those persons familiar with electronics. Unfortunately, the larger DIP sizes, which can be over three inches in length, exhibit high pin-to-pin capacitance which can seriously limit the high speed response of the chips. For instance, a 64 pin DIP can have up to a 7 pF pin-to-pin capacitance and a 1.1 ohm lead resistance at the relatively low switching speed of 1 MHz.

A partial solution to this problem is found with the QUIP (Quad In-Line Package) which includes two rows of lead-pins instead of one along each longitudinal edge, so that a QUIP can contain its 64 pins in a little over 1½ inches as opposed to the DIP's over 3 inch length. In consequence, a QUIP exhibits a maximum 3 pF pin-to-pin capacitance and a maximum 0.3 ohm lead resistance at 1 MHz, which is a substantial improvement over the DIP.

An even more attractive solution to the high density packaging problem is found with the chip carrier concept. A chip carrier consists of a small, square ceramic support barely larger than the integrated circuit die it holds and has screen printed metalized traces extending from internal bonding pads of the die to the external terminal contacts of the chip carrier. Square chip carriers occupy only one-third to one-sixth the area of a DIP, and a 64 lead chip carrier will have a 2 pF maximum inter-lead capacitance and a 0.1 ohm maximum lead resistance, resulting in an upper frequency operational limit about twice that of a DIP.

DIPs, QUIPs and chip carriers suffer from at least two common problems. First of all, all three of the aforementioned packages position the integrated circuit die parallel to the P.C. board, which is a very inefficient use of P.C. board space. Secondly, the integrated circuit chips within each of the packages can only be coupled to other chips by routing signals through a first lead-pin, a P.C. board trace and a second lead-pin of another integrated circuit package. These extremely long signal paths through a P.C. board trace severely limits the upper frequency response of the final electronic circuit.

Partially addressing the problem of long signal paths is the DIP motherboard concept. In this concept, a motherboard having DIP compatible lead-pins supports a number of directly soldered leadless chip carriers. While a DIP motherboard eliminates the need for many signal paths through a P.C. board's traces, it is a relatively inflexible device allowing only a fixed set of interconnections between the individual chip carriers.

A number of motherboard type packages have been made the object of U.S. patents. For example, R. Dennis et al, in U.S. Pat. No. 3,982,159 discloses a leadless package retaining frame including a framework having spring bias means for holding integrated circuit chips in contact with conductor pads on a motherboard. Also, N. Peterson, in U.S. Pat. No. 3,899,720 teaches a package for microwave integrated circuits having a plurality of flat integrated circuits assembled on a common circuit completing board.

A problem with even the motherboard concept is that a signal still needs to be brought out of one chip carrier down to the motherboard and then back up to another chip carrier. Thus, a problem that the prior art apparently does not address is how to couple signals from one chip carrier directly to another chip carrier without any intermediary signal path whatsoever.

SUMMARY OF THE INVENTION

It is an object of this invention to provide a package for integrated circuit chips which lends itself to the very high density loading of a P.C. board.

It is another object of this invention to provide an integrated circuit package which substantially shortens the length of the external conductive paths between itself and similar integrated circuit packages.

Yet another object of this invention is to provide a modular integrated circuit package which is easily combined with other modular packages to create a virtually unlimited number of hybrid electronic circuits.

A still further object of this invention is to provide a simple, inexpensive and reliable integrated circuit assembly as an alternative to the relatively bulky and inefficient assemblies of the prior art.

Briefly, the invention comprises a module carrier having a plurality of (usually) DIP compatible lead-pins where the carrier is designed to support, under compression, a number of distinct integrated circuit modules. Each of the modules include a substrate, an integrated circuit die positioned within a concavity provided in the substrate, and a plurality of inter-module interfaces formed on the surface of the substrate and electrically coupled to the integrated circuit die. When the modules are held together by the module carrier, the inter-modular interfaces of adjacent modules abut to provide direct module-to-module signal paths for linking the integrated circuit dies together. The modules are also preferably provided with notches in their peripheries within which are formed extra-modular interfaces for coupling, usually via a pair of bus-bars of the module carrier, the modules to the module carrier and, ultimately, to the P.C. board.

An advantage of this invention is that a great number of semiconductor devices can be located on a very small area of a P.C. board.

Another advantage of this invention is that signals can be passed directly from module-to-module to keep the signal paths very short and to improve the high frequency characteristics of the circuit.

A further advantage of this invention is that various different types of modules can be used together on a single module carrier to create any number of hybrid electronic circuits. The hybrid circuits can be changed at will by simply removing and/or adding specific modules to the assembly.

These and other objects and advantages of the present invention will no doubt become apparent upon a reading of the following detailed description as accompanied by the several figures of the drawing.

BRIEF DESCRIPTION OF THE DRAWING

FIG. 1 is a perspective view of a modular, hybrid integrated circuit assembly in accordance with the present invention which is partially broken away to show the circuit modules thereof.

FIG. 2 is a top plan view of a single integrated circuit module shown in FIG. 1.

FIG. 3 is a cross-sectional view taken along line 3—3 of FIG. 2. Visible in this figure is the substrate structure of the module, as well as a number of the electrical interconnections between the integrated circuit die an external contacts of the module.

FIG. 4 is a cross sectional view taken along line 4—4 of FIG. 2.

FIG. 5 is a cross-sectional view taken along line 5—5 of FIG. 1 to illustrate the construction of the detent mechanism which holds the assembly together.

FIG. 6 is a partially broken perspective view of a bus-bar construction for engagement with the integrated circuit modules.

DETAILED DESCRIPTION OF THE PREFERRED EMBODIMENTS

Referring to FIG. 1, a modular, hybrid integrated circuit assembly in accordance with the present invention includes a module carrier 10 and a number of integrated circuit modules 12. The module carrier includes a number of bus-bars 14 for electrically coupling the modules to the module carrier. The module carrier 10 can be seen to be divided into a header end portion 16 and a compression end portion 18 which can removably engage each other by disposing the ends of their respective bus-bars in suitably formed apertures 20 formed in the header and compression end portions. When assembled, the modular carrier is generally a rectangular prism in shape.

A plurality of lead-pins 22 extend outwardly and downwardly from at least one, but preferably two or more, of bus-bars 14. The lead-pins are configured to fit a standard DIP socket, although other spacings and configurations could also be used.

Compression end portion 18 is provided with a threaded bore through which a tensioning screw is threaded. The inner end of the tensioning screw 26 abuts the end module of a stack of modules, and presses them together against header end portion 16 with a biasing force optimal for the modules (typically 5-40 lbs.). Preferably, the tensioning screw assembly is of the detent type so that the pressure exerted on the modules can be accurately determined. Of course, other types of biasing means are suitable for this invention, such as leaf type springs located at one or both of the end portions of the module carrier.

Referring now additionally to FIGS. 2, 3 and 4, a single module is seen to include a substrate 28 having a concavity 30 and four notches 32 extending inwardly from its periphery. As best seen in FIGS. 1 and 2, the module is preferably disk shaped, although other shapes, such as triangular, square etc. are also suitable and perhaps even superior for certain applications.

In this embodiment, substrate 28 is formed from a bonded sandwich of ceramic layers 34. Formed between the ceramic layers are conductive traces (often gold), the purpose of which will be discussed later. Substrates other than ceramic, such as porcelain, plastic, plexiglass, etc., may also be used as long as they possess suitable thermal and electrical properties.

Formed through the layered substrate are a number of bores 36 which terminate in metalized contacts (again usually gold) 38. The inner surface of the bores is plated to provide a conductive path through the substrate between the respective ones of contacts 38 formed on opposing surfaces thereof.

An elastomeric coupler 40 is provided which includes a mass of non-conducting rubber 41 and lengths of conductive silicone rubber 42 formed into the zebra-style configuration well known in the art. The conductive silicone rubber forms conductive paths from contacts 38 of the substrate to its outer surface 43. When two adjacent modules are pressed together by the biasing means, elastomeric coupler 40 provides an effective, thermally stable and hermetically sealed electrical coupling between the contacts 38 of the two modules.

An integrated circuit die 44 is positioned within concavity 30. Bonding pads of the die are coupled to the aforementioned gold traces on the uppermost ceramic layer by epoxy drop bonds 46. Gold ball and aluminum bonding can also be used for the same purpose. Gold traces on the substrate sandwich layers disstribute the signals generated by die 44 to the gold plated bores 36 and thus couple the die to the external contacts of the module.

Preferably, die 44 is covered with an insulative epoxy or other substance 48 to hermetically seal it from the ambient environment, to provide for enhanced heat dissipation, and to generally protect it from harm. The remaining surfaces of the substrate are also covered with the substance 48, such as epoxy, so that the finished module has a substantially flat, disk shape. Of course, other thick and thin film technologies well known to the art can also be used for the substrates and their interconnections.

As best seen in FIG. 4, notches 32 are provided with at least one contact 52 which is a part of an extra-modular interface means. Contacts 52 are electrically coupled to certain ones of the gold traces, and thus to die 44.

In FIG. 5, a cross-sectional view of the header end portion of the module carrier is shown to include a detent type mechanism 54 consisting of two ball bearings 55 biased towards apertures 20 by a leaf spring 56. The same leaf spring also biases a lock button 57 in an upward direction. When the ends of the bus-bars 14 of compression end 18 engage the apertures of header and portion 16, depressions 58 (see FIG. 1) lock in place with ball bearings 55. To release the compression end portion, lock-button 57 is pressed to release the ball bearings from the biasing force of spring 56.

In FIG. 6, a bus-bar 60 is shown to include a metal tube covered with a first electrically insulative layer 62. A number of conductive traces, such as trace 64, extend around the bar from an electrical contact 65 to a lead pin 66. Alternatively, a lead pin 67 can extend through a side wall and top wall of the tube to likewise form an electrical contact 68. If the conductive trace method is used, it preferably should be at least partially covered with another insulative layer to prevent shorts. With such an embodiment as shown in this figure, the bus-bar acts as an efficient heat dissipation member, and can be made even more efficient by perforating the tube to form heat fins 70.

In use, the electronic function of the circuit assembly is first decided upon. Then the right modules are chosen and placed together like a stack of coins on the bus bars of the header end portion of the module carrier. The compression end portion of the module carrier is then fitted with the header end portion and the tensioning screw is used to compress the modules together. As the modules are pressed together, electrical connections are made between all of the modules by means of the inter-modular interface means, and between the modules and the module carrier by means of the extra-modular interface means and the bus-bars. The assembly is then ready for use, and can be plugged into any DIP compatible socket.

While this invention has been described in terms of a few preferred embodiments, it is contemplated that various modifications thereof will become apparent to those skilled in the art after they have read this specification. It is therefore intended that the following appended claims be interpreted as determining the true spirit and scope of the present invention.

What is claimed is:

1. A modular, hybrid integrated circuit assembly comprising:
    a module carrier including
        a header end portion,
        a compression end portion,
        a plurality of bus-bar means extending at least partially between said header end portion and said compression end portion, at least one of said bus-bar means being provided with a plurality of electrical contacts, and a plurality of lead-pins electrically coupled to said contacts, and
        biasing means coupled to said compression end portion; and
    at least two integrated circuit modules compressively held between said header end portion and said compression end portion by said biasing means, each module including
        substrate means provided with a concavity at a first surface thereof,
        an integrated circuit die positioned within said concavity, said die being provided with a plurality of bonding pads,
        inter-modular interface means including a first regions of said first surface having a plurality of metalized contacts, a second region of a second surface of said substrate having a plurality of metalized contacts, and a elastomeric coupler including a mass of resistive material interspersed with lengths of conductive material, said elastomeric coupler being attached to one of said first surface and said second surface so said lengths of conductive material are electrically coupled to said metalized contacts, whereby when a first surface side of a first module is pressed against a second surface side of a second module said elastomeric coupler couples said metalized contacts of said first region and said second region together,
    extra-modular interface means formed on the periphery of said substrate means having at least one contact engagable with a contact of said bus-bar means, and
    coupling means for coupling said contacts of said inter-modular interface means and of said extra-modular interface means to said bonding pads.

2. An assembly as claimed in claim 1 wherein
said modular carrier is substantially a rectangular prism in shape, and
said plurality of lead pins extend away from at least one of said bus-bar means to electrically couple said circuit assembly to another circuit.

3. An assembly as claimed in claim 2 wherein
said lead pins are configured and spaced so as to be adapted to fit an integrated circuit socket.

4. An assembly as claimed in claim 2 wherein
said biasing means includes
    a threaded bore provided through said compression end portion, and
    tensioning screw means engaged with said threaded bore for engaging another end module.

5. An assembly as claimed in claim 1 wherein
said substrate means includes at least one ceramic layer, and
said coupling means includes conductive traces formed on a surface of said ceramic layer for providing conductive paths from said bonding pads to said inter-modular interface means and said extra-modular interface means.

6. An assembly as claimed in claim 1 wherein
said header end portion is provided with a first pair of bus-bar means extending substantially perpendicularly therefrom, and a first pair of bus-bar apertures spaced from said bus-bar means, and
said compression end portion is provided with a second pair of bus-bar means extending substantially perpendicularly therefrom that are engagable with said first pair of bus-bar apertures, and a second pair of bus-bar apertures spaced from said second bus-bar means with which said first pair of bus-bar means are engagable.

7. An assembly as claimed in claim 6 wherein
said module is provided with at least one notch means formed inwardly from its periphery for engagement with a bus-bar means.

8. An assembly as claimed in claim 6 wherein
said bus-bar means is provided with a means for engaging a peripheral surface of said modules.

9. An assembly as claimed in claim 7 wherein
said bus-bar means include
    a metal tube of rectangular cross-section,
    a first electrically insulating layer covering at least a portion of an external portion of said tube,
    a plurality of conductive traces formed on said first layer, and
    a second electrically insulating layer covering the central portion of said conductive traces.

10. An assembly as claimed in claim 9 wherein
said metal tube is provided with a plurality of perforations to increase heat dissipation capabilities of said bus-bar.

11. An integrated circuit module for use with a modular, hybrid integrated circuit assembly comprising
    substrate means provided with a concavity at a first surface thereof, an integrated circuit die positioned within said concavity, said die being provided with a plurality of bonding pads, inter-modular interface means including a first region of said first surface having a pluality of metalized contacts, a second region of a second surface of said substrate having a plurality of metalized contacts, and a elastomeric coupler including a mass of resistive material interspersed with lengths of conductive material, said elastomeric coupler being attached to one of said first surface and said second surface so said lengths of conductive material are electrically coupled to said metalized contacts, extra-modular interface means formed on the periphery of said substrate means, and coupling means for coupling said contacts of said inter-modular interface means and of said extra-modular interface means to said bonding pads.

12. A module as claimed in claim 11 wherein said substrate means includes at least one ceramic layer, and said coupling means includes conductive traces formed on a surface of said ceramic layer for providing conductive paths from said connection pads to said inter-modular interface means and said extra-modular interface means.

13. A module as claimed in claim 11 wherein said module is provided with at least one notch means formed inwardly from its periphery for engagement with a bus-bar means.

14. A module as claimed in claim 13 wherein said substrate means is substantially disk shaped with a plurality of notch means spaced around its periphery, and said module includes an extra-modular interface means formed on at least one of said notch means.

15. A module as claimed in claim 14 wherein said coupling means further includes a conductive coupling between said bonding pads and said conductive traces.

16. A module as claimed in claim 15 wherein said coupling means further includes a plurality of bores formed through said ceramic layer in alignment with the metalized contacts of said first region and said second region, said plurality of bores being provided with a conductive wall coating for electrically connecting respective metalized contacts.

17. A module as claimed in claim 16 further comprising epoxy sealer means disposed over said die to form a protective, hermetic seal.

18. A module as claimed in claim 17 further comprising a thermally conductive material covering the portions of said first surface and said second surface that are not covered by said inter-modular interface means.

* * * * *